US012666745B2

(12) United States Patent
Gay et al.

(10) Patent No.: US 12,666,745 B2
(45) Date of Patent: Jun. 23, 2026

(54) IMAGE ACQUISITION DEVICE

(71) Applicant: STMicroelectronics (Crolles 2) SAS, Crolles (FR)

(72) Inventors: Laurent Gay, Lumbin (FR); Magali Gregoire, Crolles (FR); Bilel Saidi, Grenoble (FR); Sylvain Joblot, Domarin (FR); Benjamin Vianne, Le Cheylas (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 328 days.

(21) Appl. No.: 18/536,511

(22) Filed: Dec. 12, 2023

(65) Prior Publication Data

US 2024/0204029 A1 Jun. 20, 2024

(30) Foreign Application Priority Data

Dec. 14, 2022 (FR) ...................................... 2213292

(51) Int. Cl.
 H10F 39/00 (2025.01)
(52) U.S. Cl.
 CPC .......... H10F 39/811 (2025.01); H10F 39/011 (2025.01); H10F 39/809 (2025.01)
(58) Field of Classification Search
 CPC ..... H10F 39/811; H10F 39/011; H10F 39/809
 See application file for complete search history.

(56) References Cited

U.S. PATENT DOCUMENTS

| | | | | |
|---|---|---|---|---|
| 7,553,764 B2 * | 6/2009 | MacNamara | ....... | H10W 20/023 |
| | | | | 257/E21.597 |
| 2008/0099924 A1 * | 5/2008 | MacNamara | ....... | H10W 20/023 |
| | | | | 438/430 |
| 2011/0037137 A1 * | 2/2011 | Wehbe-Alause | ...... | H10F 39/806 |
| | | | | 257/434 |
| 2011/0108939 A1 * | 5/2011 | Marty | ................... | H10F 39/807 |
| | | | | 257/E31.097 |
| 2016/0315113 A1 | 10/2016 | Mao et al. | | |
| 2020/0083274 A1 | 3/2020 | Hirase et al. | | |

OTHER PUBLICATIONS

INPI Search Report and Written Opinion for priority application, FR 2213292, report dated Jun. 13, 2023, 8 pgs.

* cited by examiner

*Primary Examiner* — Richard A Booth
(74) *Attorney, Agent, or Firm* — Crowe & Dunlevy LLC

(57) ABSTRACT

An image sensor includes photodetection pixels formed inside and on top of a semiconductor substrate. An interconnection network coats a surface of the semiconductor substrate. The interconnection network includes a level of conductive vias in contact, by their lower surface, with the photodetection pixels. The conductive vias are made of doped polysilicon and have a heavier doping on their lower surface side than on their upper surface side.

19 Claims, 7 Drawing Sheets

IMAGE ACQUISITION DEVICE

PRIORITY CLAIM

This application claims the priority benefit of French Application for Patent No. 2213292, filed on Dec. 14, 2022, the content of which is hereby incorporated by reference in its entirety to the maximum extent allowable by law.

TECHNICAL FIELD

The present disclosure generally relates to the field of electronic devices and, in particular, to the field of image acquisition devices and, more particularly, to devices comprising a stack of an infrared image sensor and of a visible image sensor.

BACKGROUND

There has already been provided an image acquisition device comprising a stack of a plurality of sensors and particularly sensors of different types, for example an infrared image sensor and a visible image sensor, for example to simultaneously or successively acquire a visible image and a depth map of a same scene.

There exists a need to improve image acquisition devices comprising stacked sensors, and their manufacturing methods.

SUMMARY

In an embodiment, an image sensor comprises: a plurality of photodetection pixels formed inside and on top of a semiconductor substrate; and an interconnection network coating a surface of the semiconductor substrate, the interconnection network comprising a level of conductive vias in contact, by their lower surface, with the photodetection pixels, wherein said conductive vias are made of doped polysilicon and have a heavier doping on their lower surface side than on their upper surface side.

According to an embodiment, said conductive vias have a decreasing doping gradient starting from the upper surface of the substrate.

According to an embodiment, the conductive vias are doped with phosphorus or arsenic atoms.

Another embodiment provides a method of manufacturing an image sensor comprising: forming a plurality of photodetection pixels inside and on top of a semiconductor substrate; and forming a level of conductive vias of an interconnection network, the vias being in contact by their lower surface with the photodetection pixels, the conductive vias being made of doped polysilicon and having a heavier doping on their lower surface side than on their upper surface side.

According to an embodiment, said vias have a decreasing doping gradient starting from the upper surface of the substrate.

According to an embodiment, the forming of the conductive vias comprises a step of forming of openings in an insulating layer, in contact with the photodetection pixels.

According to an embodiment, the forming of the conductive vias comprises, after the step of forming of the openings, the following successive steps: forming an amorphous silicon film on top and inside of the openings; ex-situ doping of said film by the implantation of dopants; and filling the openings with an amorphous silicon layer.

According to an embodiment, at the end of the step of doping of the film, said film has a doping in the order of $1\times1^{21}$ at/cm$^3$.

According to an embodiment, the amorphous silicon of the film is further doped in-situ during its deposition.

According to an embodiment, the silicon of said layer is doped in-situ during its deposition.

According to an embodiment, the forming of the conductive vias comprises, after the step of forming of the openings, the following successive steps: filling the openings with an amorphous silicon layer; and ex-situ doping of said layer, in the vicinity of the semiconductor substrate, by the implantation of dopants.

According to an embodiment, the silicon of said layer is further doped in-situ during its deposition.

According to an embodiment, at the end of the step of doping of the layer, said layer has a doping, in the vicinity of the substrate, in the order of $1\times10^{21}$ at/cm$^3$.

According to an embodiment, the method comprises, after the forming of the openings in the insulating layer in contact with the photodetection pixels, a step of amorphization of the surface of substrate and of the surface of polysilicon conductive gates at the bottom of the openings.

Another embodiment provides an image acquisition device comprising a first image sensor and a second image sensor such as defined hereabove, the first image sensor and the second image sensor being stacked.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, only steps allowing the forming of an interconnection network of a sensor have been detailed hereafter. The forming of the other elements of the image acquisition device, for example, the forming of the photoreceivers and of the associated readout circuits, has not been detailed, the described embodiments being compatible with usual embodiments of these elements or the forming of these elements being within the abilities of those skilled in the art based on the indications of the present disclosure.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

Figure 1:
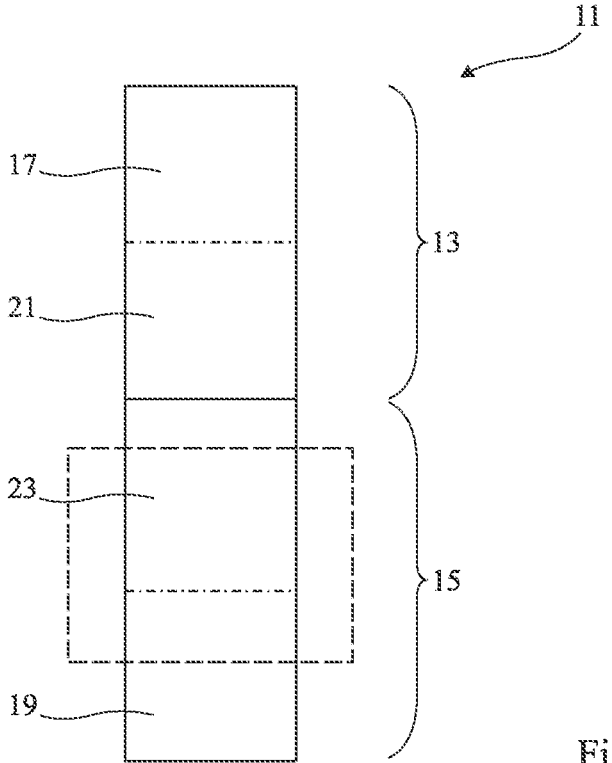
FIG. 1 is a partial and simplified cross-section view of an image acquisition device.

FIG. 1 is a partial and simplified cross-section view of an image acquisition device 11 according to an embodiment.

Image acquisition device 11 corresponds, for example, to the assembly of a first structure 13 corresponding to a first image sensor, and of a second structure 15 corresponding to a second image sensor. The first image sensor is, for example, an infrared light sensitive image sensor and the second image sensor is, for example, a visible light color sensitive image sensor, for example a color image sensor. In this example, the infrared sensor 13 and the visible sensor 15 are stacked one above the other.

As an example, each of sensors 13 and 15 comprises an assembly of pixels formed inside and on top of a semiconductor substrate. Each pixel comprises a photoreceiver, for example a photodiode, and a readout circuit of the photoreceiver. Thus, sensor 13 comprises an assembly of pixels 17 and sensor 15 comprises an assembly of pixels 19. Further, each of sensors 13 and 15 comprises a network of interconnection of the sensor pixels. Sensor 13 thus comprises an interconnection network 21 and sensor 15 comprises an interconnection network 23. In the shown example, infrared sensor 13 is arranged on visible sensor 15. The lower surface of the interconnection network 21 of sensor 13 is in contact with the upper surface of the interconnection network 23 of sensor 15. The assembly of pixels 17 of infrared sensor 13 is arranged on the upper surface side of interconnection network 21. The assembly of pixels 19 of visible sensor 15 is arranged on the lower surface side of interconnection network 23.

Device 11 is, in the example illustrated in FIG. 1, intended to be illuminated on its lower surface. The visible radiations are absorbed by the photodetectors of the pixels of sensor 15, which allows the acquisition of an image in the wavelength range of the visible spectrum. Sensor 15 is however substantially transparent to infrared radiations. These radiations are absorbed by the photodetectors of sensor 13, which allows the acquisition of an image in the wavelength range of the infrared and near infrared spectrum.

In each of sensors 13 and 15, the sensor pixels are arranged, for example, in an array of rows and of columns.

Figure 2:
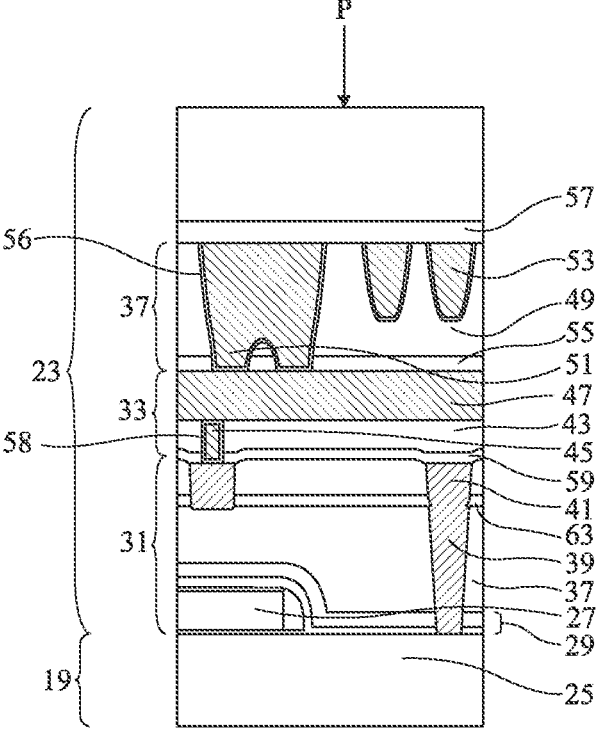
FIG. 2 is a more detailed cross-section view of a portion of the image acquisition device of FIG. 1.

FIG. 2 is a more detailed cross-section view of a portion of the image acquisition device 11 of FIG. 1. More precisely, FIG. 2 shows in more detailed fashion the portion of the device 11 of FIG. 1 surrounded with dotted lines in FIG. 1, that is, a portion of interconnection network 23 and a portion of the assembly of pixels 19 of sensor 15.

In FIG. 2, a portion of a pixel P of sensor 15 is shown. As an example, each pixel P comprises a photodetector, not shown, formed inside and on top of a substrate 25. Substrate 25 is made of a semiconductor material, for example of silicon. Each photodetector is connected to a readout circuit comprising transistors including gates 27, formed on substrate 25. Gates 27 are, for example, made of polysilicon, for example doped with a first conductivity type, for example of type N, for example doped with phosphorus atoms.

The upper surfaces of substrate 25 and gates 27 are covered, for example, with an insulating layer 29, for example crossed by vias 41 coupling interconnection network 33 to the assembly of the photodetectors and of their readout circuits. As an example, layer 29 is made of a nitride and/or of an oxide, for example of a silicon nitride ($Si_xN_y$), of a silicon carbonitride ($SiC_xN_y$), and/or of a silicon dioxide ($SiO_2$). As an example, layer 29 comprises a first sub-layer on top of and in contact with the upper surface of substrate 25 and with the upper surface of gates 27 and a second sub-layer on top of and in contact with the upper surface of the first sub-layer. The first sub-layer is made, for example, of silicon dioxide. The second sub-layer is made, for example, of silicon nitride.

Interconnection network 23 is formed of a stack or network of electrically-conductive levels and of electrically-insulating levels having interconnection elements formed therein. In FIG. 2, three levels are shown in interconnection network 23, a first level 31, called lower level, coating the upper surface of substrate 25, for example on top of and in contact with the upper surface of layer 29, a second level 33 coating the first level, for example on top of and in contact with the upper surface of the first level, and a third level coating the second level, for example on top of and in contact with the upper surface of the second level. In practice, network 23 may comprise a number of levels different from three, for example greater than three.

As an example, each level comprises a layer made of an insulating material having conductive tracks and vias formed therein.

Lower level 31 thus comprises, for example, an electrically-insulating layer 37 having electrically-conductive vias 39 and electrically-conductive tracks 41 formed therein. Similarly, second level 33 comprises, for example, an electrically-insulating layer 43 having electrically-conductive vias 45 and electrically-conductive tracks 47 formed therein and third level 35 comprises, for example, an electrically-insulating layer 49 having electrically-conductive vias 51 and electrically-conductive tracks 53 formed therein.

As an example, vias 39 are in contact, by their lower surface, with the substrate 25 or with the gates 27 of the transistors of the pixel readout circuits, and, by their upper surface, with the lower surface of tracks 41. Vias 45 are in contact, for example by their lower surface, with the upper surface of tracks 41, and in contact, for example by their upper surface, with the lower surface of tracks 47. Vias 51 are in contact, for example by their lower surface, with the upper surface of tracks 47, and in contact, for example by their upper surface, with the lower surface of tracks 53.

Layers 37, 43, and 49 are made of silicon dioxide ($SiO_2$) and/or of silicon nitride ($Si_xN_y$) and/or of silicon carbonitride ($SiC_xN_y$). As an example, layers 37, 43, and 49 each correspond to a stack of the above-mentioned materials.

Vias 45 and 51 and tracks 47 and 53 are made of metal, for example of transition metal, for example of tungsten, of copper, of cobalt, or of ruthenium. As an example, vias 45 are made of tungsten, and vias 51 and tracks 53 and 47 are made of copper.

As an example, the levels of interconnection network 23 are separated by encapsulation layers.

In the shown example, an encapsulation layer 55 thus covers the second level and an encapsulation layer 57 covers the third level of interconnection network 23. Encapsulation layers 55 and 57 are, for example, made of an electrically-insulating material enabling to form a barrier to the diffusion of copper or of certain ions in the silicon of layers 37, 43, and 49. As an example, encapsulation layers 55 and 57 are made of a material different from copper, for example of silicon nitride or of silicon carbonitride (SiCN).

Similarly, vias 45 and 51 and tracks 53 and 47 are surrounded with a layer enabling to form a barrier to the diffusion of the materials of vias, for example copper or tungsten, in the silicon of layers 43 and 49. In the shown example, vias 51 and tracks 53 and 47 are surrounded, for example encapsulated, with a barrier layer 56 and via 45 is surrounded with a barrier layer 58. Barrier layer 56 is, for example, made of tantalum nitride (TaN) and barrier layer 58 is, for example, made of titanium and/or of titanium nitride (TiN).

As an example, the conductive tracks 41 of level 31 are arranged on top of and in contact with a layer 63 and are covered and in contact with a layer 59. Layers 63 and 59 are, for example, both made of a dielectric material, for example of nitride, for example of silicon nitride.

The transparency of sensor 15 to the radiations captured by sensor 13 is provided by the transparency of the above-described assembly of elements and more particularly of the assembly of photodetectors 19 and of interconnection network 23.

As an example, the assembly of pixels 19 of sensor 15 is transparent to infrared radiations. Interconnection network 23 may however comprise electric connection elements (electric connection tracks and/or vias), for example metallic, non-transparent to infrared radiations.

In this example, although this is not shown in FIG. 2, it is provided to offset to the periphery of pixels P the tracks and the vias of the upper levels of interconnection network 23. This enables to leave a passage transparent to infrared radiations in front of a central portion of pixels P.

The vias 39 of the lower level 31 of interconnection network 23 enable to take a contact on the upper surface of gates 27 as well as at different locations at the surface of substrate 25, for example on sense nodes of pixels P. Their offsetting to the periphery of pixels P is thus not possible.

According to an aspect of an embodiment, it is provided to form the vias 39 and the tracks 41 of the first level of interconnection network 23 with doped polysilicon, which has the advantage of being transparent to infrared radiations. To favor the ohmic contact with the underlying components while maximizing the transparency, it is further provided to dope vias 39 with a decreasing doping gradient starting from their lower surface.

This enables to improve the transparency of interconnection network 23 to infrared radiations in front of pixels P, and thus to increase the flux received by infrared sensor 13.

Figure 3A:
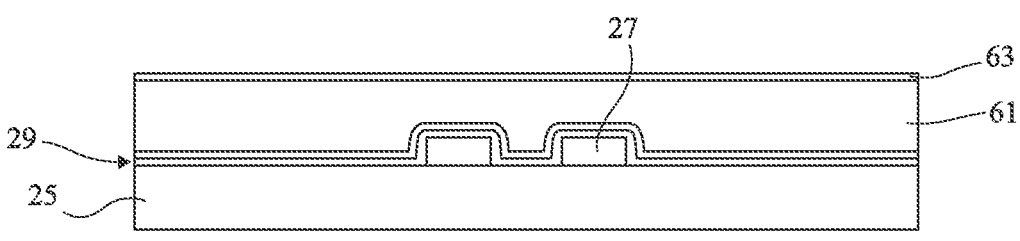
FIGS. 3A to 3P are cross-section views illustrating steps of a method of manufacturing the portion of the image acquisition device illustrated in FIG. 2 according to a first implementation mode.
Figure 3B:
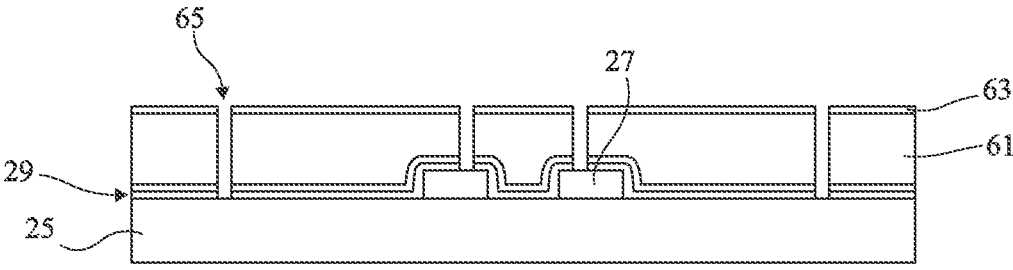
Figure 3C:
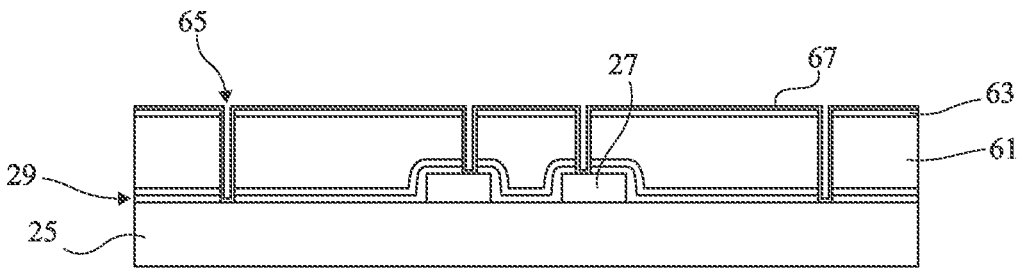
Figure 3D:
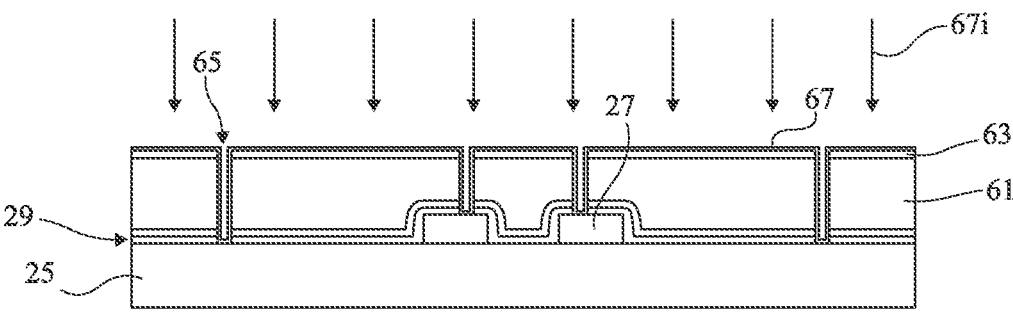
Figure 3E:
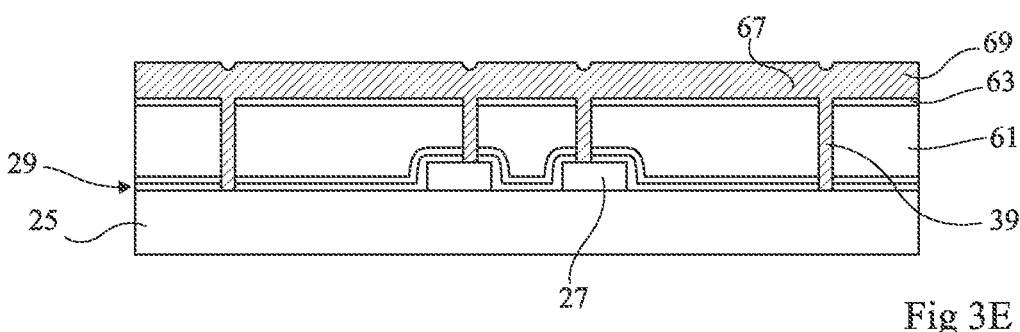
Figure 3F:
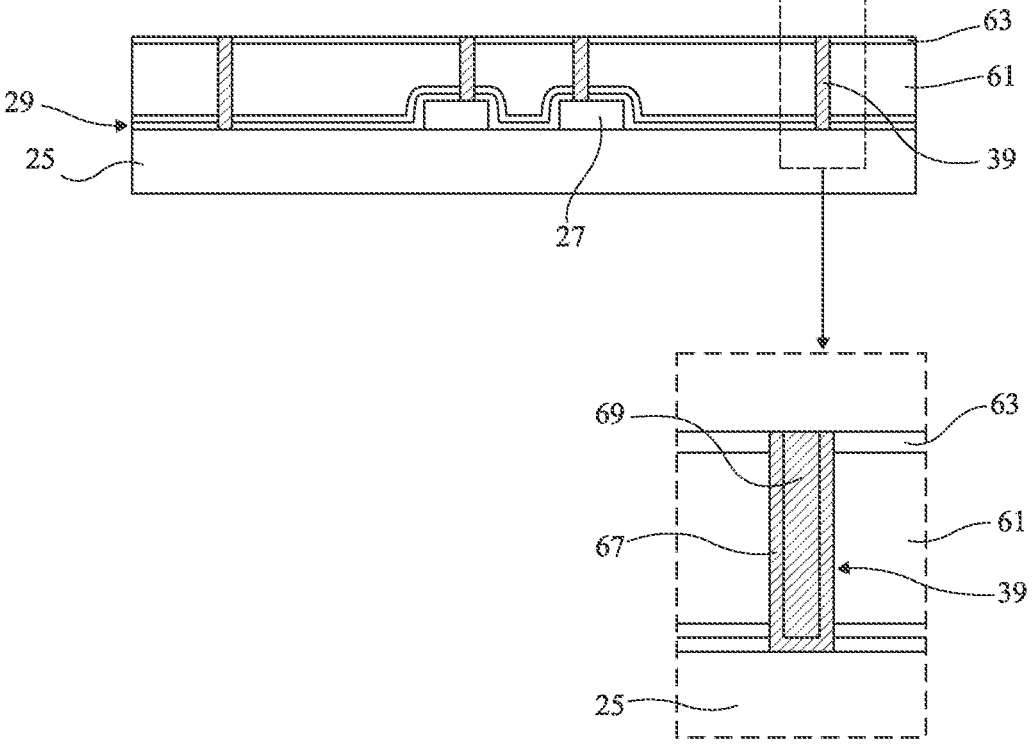
Figure 3G:
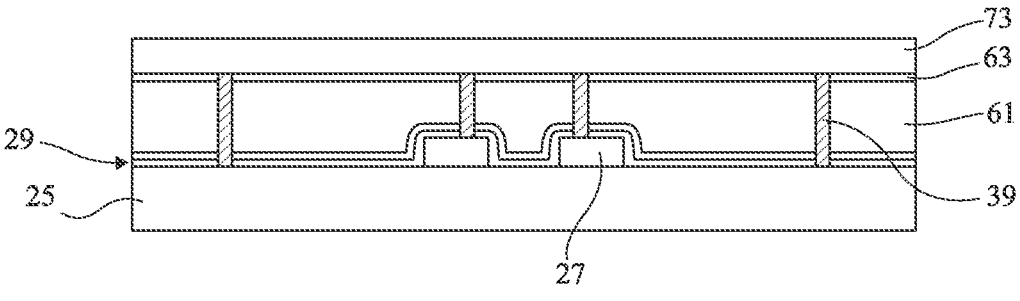
Figure 3H:
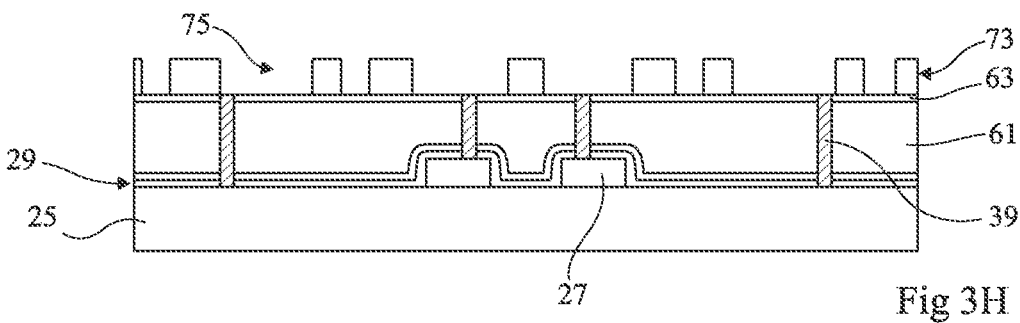
Figure 3I:
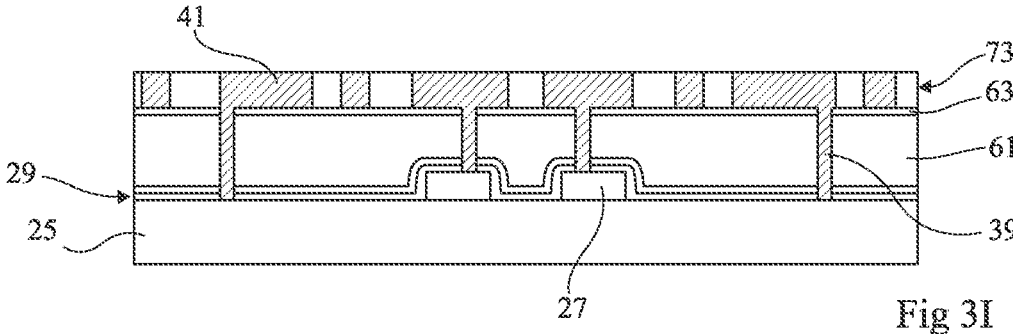
Figure 3J:
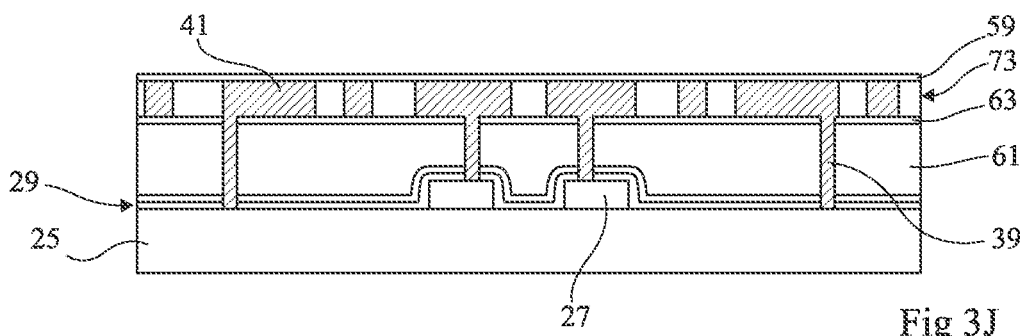
Figure 3K:
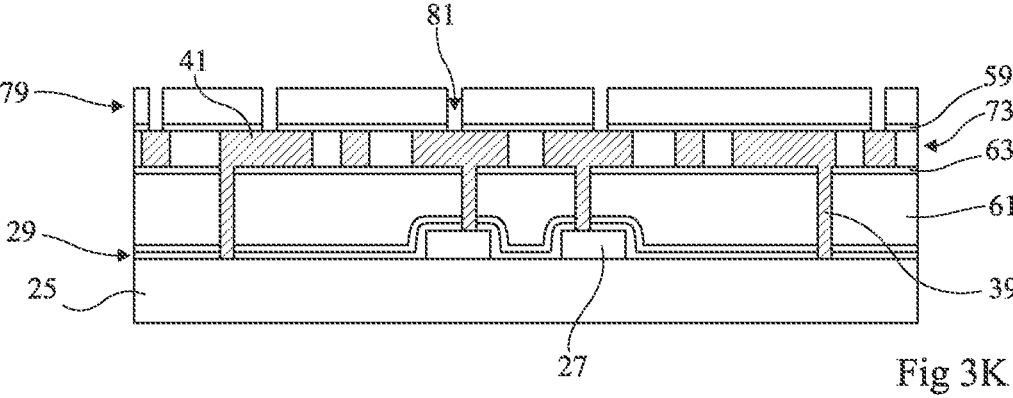
Figure 3L:
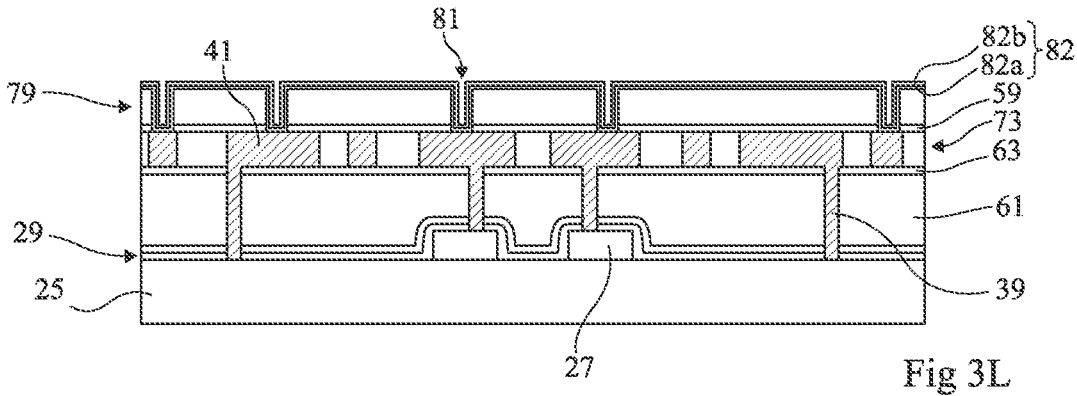
Figure 3M:
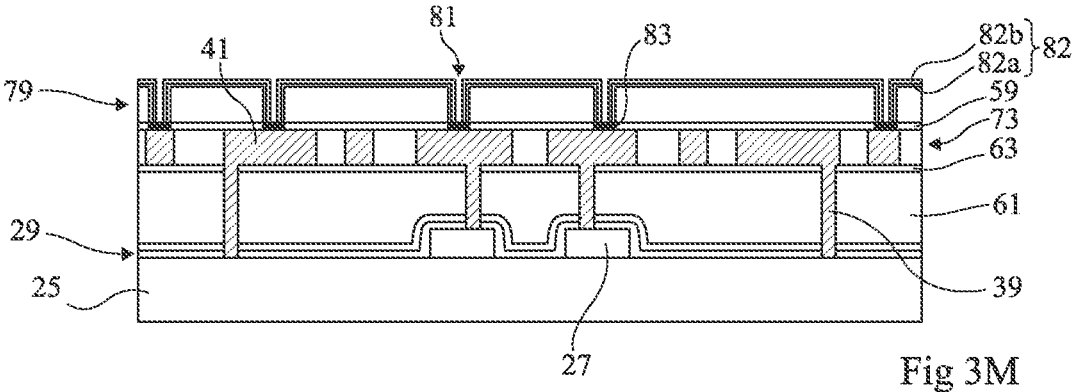
Figure 3N:
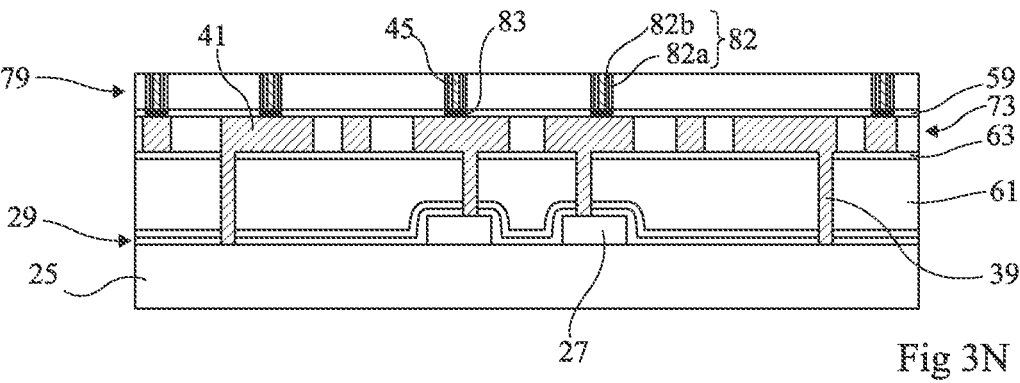
Figure 3O:
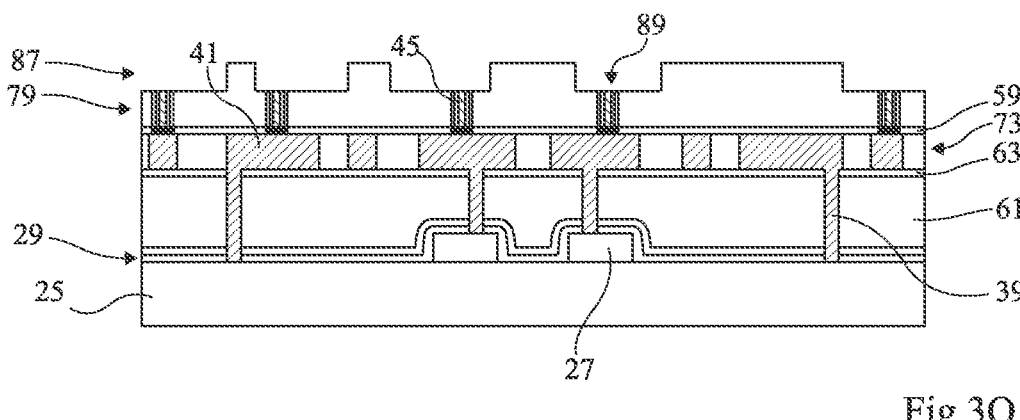
Figure 3P:
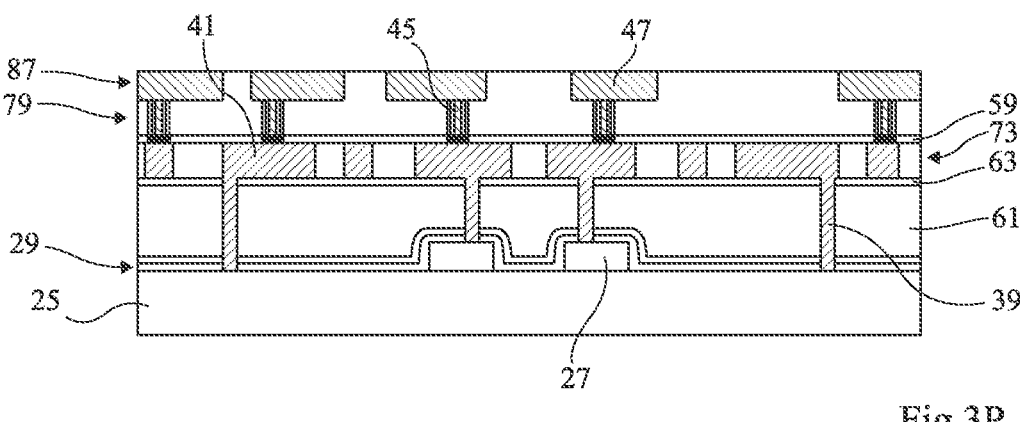

FIGS. 3A to 3P are cross-section views illustrating steps of a method of manufacturing the portion of the image acquisition device illustrated in FIG. 2 according to a first implementation mode.

FIG. 3A illustrates an initial structure of the method. More particularly, FIG. 3A very schematically illustrates a portion only of the elements of a pixel P.

The structure illustrated in FIG. 3A comprises substrate 25 having the plurality of photodetectors and of readout transistors formed inside and on top thereof. As an example, the structure illustrated in FIG. 3A comprises the gates 27 of readout transistors formed on substrate 25 and, for example separated from substrate 25 by a gate insulator layer (not detailed in the drawing).

In the initial structure of FIG. 3A, substrate 25 and gates 27 are covered with layer 29. As an example, layer 29 is formed conformally, that is, it is deposited with a constant thickness over the entire surface of the structure.

As an example, layer 29 is covered with an insulating layer 61. As an example, layer 61 is made of an oxide, for example, silicon dioxide ($SiO_2$). As an example, layer 61 covers layer 29 with a thickness in the range from 190 nm to 500 nm, for example from 300 nm to 450 nm, for example in the order of 380 nm.

Layer 61 is, for example, covered with a dielectric layer 63. Layer 63 is made of a nitride, for example of silicon nitride ($Si_xN_y$) or of silicon carbonitride ($SiC_xN_y$). As an example, layer 63 has a thickness in the range from 10 nm to 100 nm, for example in the range from 30 nm to 70 nm.

FIG. 3B illustrates a structure obtained at the end of a step of forming of openings 65 in the structure illustrated in FIG. 3A.

More particularly, there are during this step formed openings 65 from the upper surface of the structure illustrated in FIG. 3A, so that they emerge onto the upper surface of substrate 25 or the upper surface of gates 27. Openings 65 thus cross layer 63, layer 61, and layer 29.

During this step, a plurality of openings 65 are formed. An opening 65 is formed in front of each gate 27 and an opening 65 is formed in front of each sense node (not shown) of substrate 25.

Openings 65 are, for example, formed by etching through a masking layer, not shown. As an example, openings 65 have a width in the range from 50 nm to 150 nm, for example in the range from 90 nm to 100 nm.

FIG. 3C illustrates a structure obtained at the end of a step of deposition of a silicon film 67 on the structure illustrated in FIG. 3B. More particularly, film 67 is deposited on the upper surface of the layer 63 and inside of openings 65, more particularly in the bottom and on the sides of openings 65.

During its deposition, film 67 is, for example, made of amorphous silicon. As an example, film 67 is, for example, conformally deposited, that is, it is deposited over the entire upper surface of the structure illustrated in FIG. 3B with a substantially constant thickness. Film 67 has, for example a thickness in the range from 19 nm to 40 nm, for example in the range from 30 nm to 35 nm. As an example, film 67 is formed by low-pressure chemical vapor deposition (LPCVD).

As an example, the material forming film 67 is doped during its deposition on the upper surface of the structure illustrated in FIG. 3B, this being referred to in the art as an in-situ doping. The material forming film 67 is, for example, doped with a first conductivity type, for example type N, for example doped with arsenic or phosphorus atoms. As an example, at the end of this step, film 67 has a doping in the order of $3\times10^{19}$ at/$cm^3$.

As an example, the deposition of film 67 is preceded by a step of treatment of the surface of the structure illustrated in FIG. 3C.

FIG. 3D illustrates a structure obtained at the end of a step of doping of the film 67 of the structure illustrated in FIG. 3C. During this step, the structure illustrated in FIG. 3C is doped by implantation of dopant elements from its upper surface, this is referred to in the art as an ex-situ doping.

As an example, this step is carried out without a mask or masking layer. However, layer 63 may act as a masking layer by protecting layer 61 from the implantation of dopants 67*i*. Thus, during this step, only film 67 is doped and more particularly the bottom of openings 65 is, among others, doped. This doping step consists of the implantation in film 67 of atoms of the first conductivity type, for example type N, for example of arsenic or phosphorus atoms. The doping is, for example performed with a dose in the range from $2 \times 10^{14}$ at/cm$^2$ to $1 \times 10^{16}$ at/cm$^2$, for example in the range from $5 \times 10^{14}$ at/cm$^2$ to $1 \times 10^{16}$ at/cm$^2$.

As an example, at the end of this step, film 67 has a doping in the range from $4 \times 10^{19}$ at/cm$^3$ to $4 \times 10^{22}$ at/cm$^3$, for example in the order of $1 \times 10^{21}$ at/cm$^3$.

FIG. 3E illustrates a structure obtained at the end of a step of filling of the openings 65 of the structure illustrated in FIG. 3D.

During this step, openings 65 are filled and the upper surface of the structure illustrated in FIG. 3D is covered with amorphous silicon to form a layer 69 on top of and in contact with doped layer 67. As an example, the amorphous silicon used during this step is doped in-situ during its deposition, for example with the first conductivity type, for example type N, for example with arsenic or phosphorus atoms. The amorphous silicon used to form layer 69 is for example doped in the order of $1 \times 10^{20}$ at/cm$^3$.

Optionally, at the end of this step, there may be provided an additional doping step and more particularly a step of local doping of the second conductivity type, for example of type P, for example doped with boron or boron difluoride (BF$_2$) atoms. As an example, this step aims at locally doping the portions of layer 69 located in a portion of openings 65 and more precisely the portions of layer 69 located in openings 65 which are in contact with an area of substrate 25, preferably P doped. The local doping is, for example, performed through a masking layer, for example made of resin.

FIG. 3F illustrates a structure obtained at the end of a step of polishing of the upper surface of the structure illustrated in FIG. 3E. In this drawing, there has further been shown an enlargement of a portion of the structure comprising a via 39.

During this step, layer 69 and film 67 are removed to expose the upper surface of the layer 63. The portions of layer 69 and of film 67 remaining in openings 65 thus form vias 39. At the end of this step, the upper surface of vias 39 is flush with the upper surface of layer 63. The polishing step is, for example carried out by a mechanical method, for example a chemical-mechanical method CMP ("Chemical Mechanical Polishing"). As an example, this step enables to level the upper surface of the structure down to layer 63 enabling to control the end of the leveling.

The polishing step is, for example, followed by an anneal step allowing the activation of the doping of vias 39. As an example, the anneal step is carried out under a temperature higher than 800° C., for example higher than 900° C., for example in the range from 900° C. to 1,050° C.

At the end of this step, the material of vias 39 passes from an amorphous state to a polycrystalline state. Vias 39 are, at the end of this step, made of a doped polysilicon. Vias 39 being formed of film 67 and of layer 69, their dopings are heavier in the vicinity of substrate 25, vias 39 thus have a decreasing doping gradient starting from the upper surface of substrate 25.

FIG. 3G illustrates a structure obtained at the end of a step of deposition of a layer 73 on the upper surface of the structure illustrated in FIG. 3F.

As an example, during this step, layer 73 is more particularly deposited on top of and in contact with the upper surface of layer 63 and the upper surface of vias 39. Layer 73 is made of a dielectric material, for example of silicon oxide, for example of silicon dioxide (SiO$_2$). As an example, layer 73 is deposited by plasma enhanced chemical vapor deposition (PECVD). As an example, layer 73 has a thickness in the range from 100 nm to 500 nm, for example in the order of 155 nm.

FIG. 3H illustrates a structure obtained at the end of a step of forming of openings 75 in the layer 73 of the structure illustrated in FIG. 3G.

This step is similar to the step of forming of openings 65 in the layers 61, 63, and 29 described in relation with FIG. 3B, with the difference that openings 75 are formed from the upper surface of layer 73 and that they emerge onto the upper surface of layer 63 and onto the upper surface of vias 39. As an example, openings 75 are wider than openings 65, openings 65 receiving vias 39 and openings 41 receiving the first level of track 41 of the interconnection network. As an example, each via 39 is topped with an opening 75.

FIG. 3I illustrates a structure obtained at the end of a step of filling of the openings 75 of the structure illustrated in FIG. 3H.

During this step, first, openings 75 are filled and the upper surface of the structure illustrated in FIG. 3H is covered with amorphous silicon, for example doped in-situ.

Then, the excess amorphous silicon deposited on the upper surface of the structure is removed to expose the upper surface of layer 73. As an example, this step is carried out by polishing. The polishing step is, for example, carried out by a mechanical method, for example a chemical-mechanical method or CMP ("Chemical Mechanical Polishing"). The amorphous silicon portion remaining in openings 75 thus forms tracks 41. At the end of this step, the upper surface of tracks 41 is flush with the upper surface of layer 73.

The polishing step is, for example, followed by an anneal step. As an example, the anneal step is carried out under a temperature higher than 800° C., for example higher than 900° C., for example in the range from 900° C. to 1,050° C.

At the end of this step, the material of tracks 41 transits from an amorphous state to a polycrystalline state.

FIG. 3J illustrates a structure obtained at the end of a step of deposition of a layer 59 on the upper surface of the structure illustrated in FIG. 3I.

During this step, the upper surface of layer 73 and the upper surface of tracks 41 are more particularly covered with a layer 59.

Layer 59 is, for example, formed over the entire wafer. As an example, layer 59 is formed conformally. As an example, layer 41 has a thickness in the range from 10 nm to 100 nm, for example in the range from 30 nm to 70 nm. Layer 41 is, for example, deposited by PECVD.

Layer 59 is made of a dielectric material, for example of a nitride, for example of silicon nitride (Si$_x$N$_y$) or of silicon carbonitride (SiC$_x$N$_y$).

The forming of layer 59 completes the forming of the lower level 31 of interconnection network 23. Steps 3K to 3O illustrate the forming of an additional level of interconnection network 23, for example second level 33, these steps are thus, for example repeated until the desired number of levels in interconnection network 23 is obtained.

FIG. 3K illustrates a structure obtained at the end of a step of forming of a layer 79 on the upper surface of the structure illustrated in FIG. 3J, followed by a step of forming of openings 81 in layers 79 and 59.

As an example, the step of forming of layer 79 is similar to the step of forming of layer 79 described in relation with FIG. 3K and the step of forming of openings 81 is similar to the step of forming of openings 41 described in relation with FIG. 3H.

As an example, openings 81 are formed in front of tracks 41 and emerge onto tracks 41.

FIG. 3L illustrates a structure obtained at the end of a step of cleaning of the bottom of openings 81 and of forming of a layer 82 on the upper surface of the structure illustrated in FIG. 3K.

As an example, during this step, the bottom of openings 81 is first cleaned, for example by means of an argon plasma.

Then, a layer 82 is formed over the entire wafer, for example comprising a sub-layer 82a and a sub-layer 82b, on the upper surface of the structure illustrated in FIG. 3K, and more particularly on the upper surface of layer 79 and on the sides and in the bottom of openings 81.

As an example, sub-layer 82a is made of titanium. Sub-layer 82a has, for example, a thickness smaller than 50 nm, for example smaller than 30 nm, for example in the range from 5 nm to 30 nm. Sub-layer 82a is, for example, formed by a physical vapor deposition method or PVD. Sub-layer 82b is, for example, formed on top of and in contact with sub-layer 82a. As an example, sub-layer 82b is made of silicon nitride. Sub-layer 82b is, for example, formed by deposition of successive atomic layers or ALD ("Atomic Layer Deposition"). Sub-layer 82b enables, for example, to protect sub-layer 82a from oxidation.

FIG. 3M illustrates a structure obtained at the end of a step of annealing of the structure illustrated in FIG. 3L to form an intermetallic silicide 83 originating from layer 82.

During this step, the structure undergoes an anneal enabling to have the titanium of sub-layer 82a react with the silicon of tracks 41 to form, in the bottom of openings 81, a thin film of an intermetallic compound called silicide. The silicide is based on silicon and on titanium, the silicide is a titanium disilicide ($TiSi_2$) or a titanium silicide (TiSi) according to the applied anneal.

FIG. 3N illustrates a structure obtained at the end of a step of filling of the openings 81 of the structure illustrated in FIG. 3M, to form vias 45.

During this step, first, openings 81 are filled and the upper surface of the structure illustrated in FIG. 3M is covered with a metallic material. As an example, the metallic material is made of copper, of tungsten, or of cobalt.

As an example, the filling of openings 81 is performed while the portions of layer 82 which have not reacted with the silicon of contacts 41, during the step of forming of silicide 83, are kept on the sides of openings 81. Layer 82 thus has the function of a barrier to the diffusion of the material of vias 45 in layer 79.

Then, the excess metallic material deposited on the upper surface of the structure is removed to expose the upper surface of layer 79. As an example, this step is carried out by polishing. The polishing step is, for example carried out by a mechanical method, for example a chemical-mechanical polishing (CMP). What remains of metallic material in openings 81 thus forms tracks 45. At the end of this step, the upper surface of tracks 45 is flush with the upper surface of layer 79.

FIG. 3O illustrates a structure obtained at the end of a step of forming of a layer 87 on the upper surface of the structure illustrated in FIG. 3N followed by a step of forming of openings 89 in layer 87.

As an example, the step of forming of layer 87 is similar to the step of forming of layer 73 described in relation with FIG. 3G and the step of forming of openings 89 is similar to the step of forming of openings 41 described in relation with FIG. 3H.

As an example, each via 45 is topped with an opening 89.

FIG. 3P illustrates a structure obtained at the end of a step of filling of the openings 89 of the structure illustrated in FIG. 3O, to form tracks 47.

During this step, first, a barrier layer, not shown, is deposited all over the upper surface of the structure illustrated in FIG. 3O, and more precisely in the bottom and on the sides of openings 89. This barrier layer enables, for example, to avoid the diffusion of copper atoms in layer 87. As an example, the barrier layer is made of tantalum and/or of tantalum nitride (TaN). As an example, the barrier layer comprises a first sub-layer made of tantalum nitride. As an example, the barrier layer comprises a second tantalum sub-layer.

Then, contacts 47 are formed in openings 89, on top of and in contact with the barrier layer. As an example, contacts 47 are made of a metallic material, for example of copper.

As an example, contacts 47 are formed by deposition of a copper layer, for example all over the wafer. The copper layer deposition is, for example, followed by an electrolytic growth of this layer.

As an example, at the end of the electrolytic growth step, a polishing step, for example chemical-mechanical, is carried out to expose the upper surface of layer 87. At the end of this step, the upper surface of contacts 47 is flush with the upper surface of layer 87.

Although this is not shown, the forming of level 33 of interconnection network 23 is, for example, completed by the forming of a layer made of a dielectric, for example of a nitride, for example of silicon nitride ($Si_xN_y$) or of silicon carbonitride ($SiC_xN_y$).

An advantage of the first embodiment is that it allows the doping of the portion of film 67 located on the sides of openings 65, thus creating a more conductive layer on the side of vias 39 and decreasing the resistance thereof.

Figure 4A:
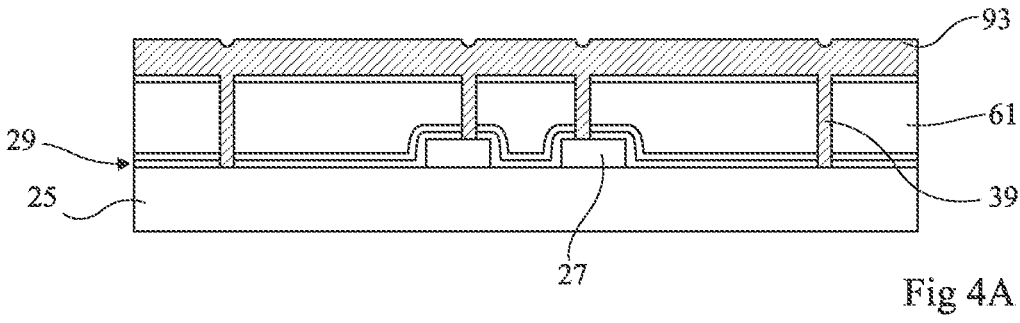
FIG. 4A and FIG. 4B are cross-section views illustrating steps of a method of manufacturing the portion of the image acquisition device illustrated in FIG. 2 according to a second implementation mode.
Figure 4B:
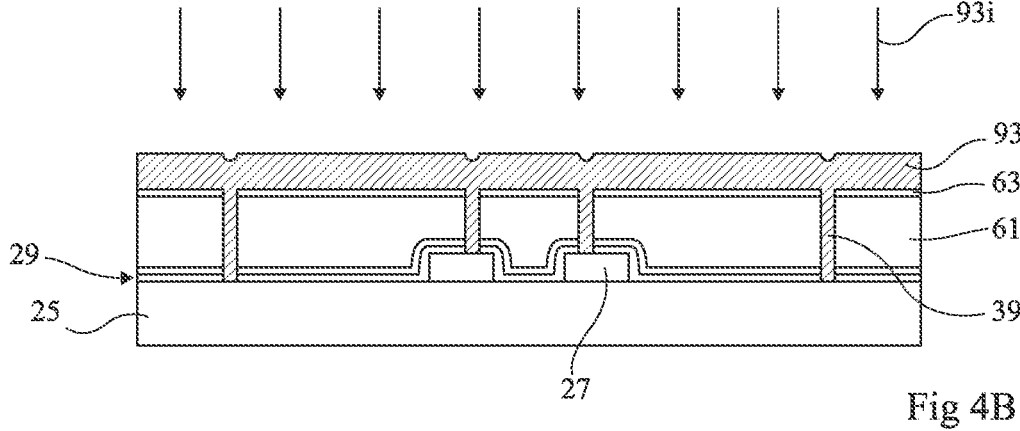

FIG. 4A and FIG. 4B are cross-section views illustrating steps of a method of manufacturing the portion of the image acquisition device illustrated in FIG. 2 according to a second implementation mode.

The second embodiment differs from the first embodiment in that, at the end of the step described in relation with FIG. 3B, openings 65 are filled with a silicon layer 93 with no prior forming of film 67 (as described in relation with FIG. 3C) and in that layer 93 undergoes an implantation after its deposition.

FIG. 4A illustrates a structure obtained at the end of a step of deposition of layer 93 in openings 65 and at the surface of the structure illustrated in FIG. 3B.

During this step, openings 65 are filled and the upper surface of the structure illustrated in FIG. 3B is covered with amorphous silicon to form layer 93 on top of and in contact with layer 63. As an example, layer is, during this step, doped in-situ during its deposition, for example of the first conductivity type, for example of type N, for example with arsenic or phosphorus atoms. The amorphous silicon used to form layer 93 is, for example, doped in the order of $1 \times 10^{19}$ at/$cm^3$.

FIG. 4B illustrates a structure obtained at the end of a step of doping of layer 93 of the structure illustrated in FIG. 4A. During this step, the structure illustrated in FIG. 4A is for example doped from its upper surface.

As an example, this step is carried out without a mask or masking layer. However, layer 63 may act as a masking layer by protecting layer 61 from the implantation of dopants 93i.

Thus, during this step, only layer 93 is doped and more particularly the portions of layer 93 located in openings 65 are, among others, doped. This doping step consists in the implantation into the above-mentioned layer of arsenic or phosphorus atoms. As an example, the doping of layer 93 corresponds to a depth doping, that is, the portions of layer 93 located at the bottom of openings 65 will be more heavily doped than the portions of layer 93 located at the surface of openings 65. The doping is, for example, performed with a dose in the range from $2\times10^{14}$ at/cm$^2$ to $1\times10^{16}$ at/cm$^2$, for example in the range from $5\times10^{14}$ at/cm$^2$ to $1\times10^{16}$ at/cm$^2$.

At the end of this step, layer 93 has, for example, a doping, in the vicinity of substrate 25 and of gates 27, in the range from $4\times10^{19}$ at/cm$^3$ to $4\times10^{22}$ at/cm$^3$, for example in the order of $1\times10^{21}$ at/cm$^3$.

Optionally, at the end of this step, there may be provided an additional doping step and more particularly a step of local doping of the second conductivity type, for example of type P similarly to what has been described in relation with FIG. 3E.

At the end of this step, the second embodiment is identical to the first embodiment, the doping step is then followed by the steps illustrated in FIGS. 3F to 3O.

The step described in relation with FIG. 3F of polishing and annealing of the structure, enables to form vias 39 from layer 93. During this step, the material of vias 39 passes from an amorphous state to a polycrystalline state. Vias 39 are, at the end of this step, made of polysilicon doped with a decreasing doping gradient from the upper surface of substrate 25.

Figure 5:
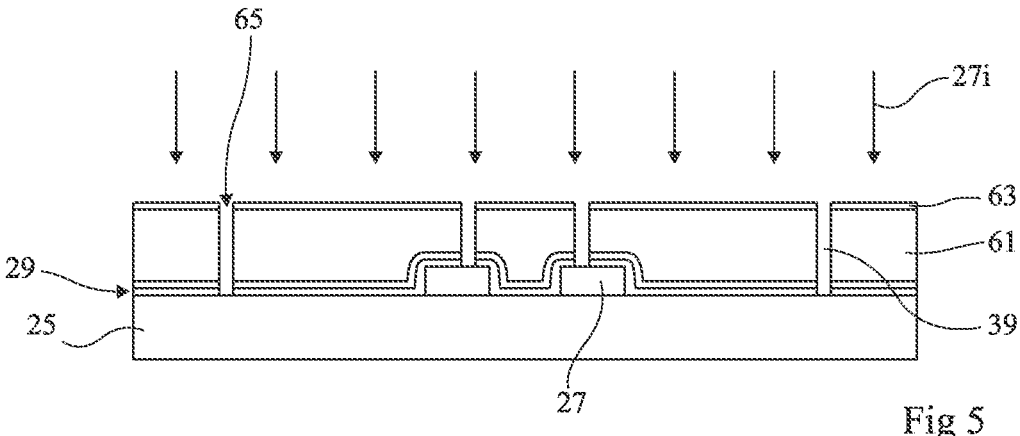
FIG. 5 is a cross-section view illustrating a step of a method of manufacturing the portion of the image acquisition device illustrated in FIG. 2 according to a third implementation mode.

FIG. 5 is a cross-section view illustrating a step of a method of manufacturing the portion of the image acquisition device illustrated in FIG. 2 according to a third implementation mode.

The third embodiment is similar to the first embodiment, with the difference that it comprises a step of processing of the upper surface of the structure illustrated in FIG. 3B.

During this step, the upper surface of the structure illustrated in FIG. 3B and, more particularly, the portions of the surface of gates 27 and of substrate 25 located in front of openings 65, are amorphized. This step allows a crystallographic rearrangement of the above-mentioned portions and thus a better electric contact with the via 39 formed afterwards in openings 65.

As an example, this step consists of the implantation of neutral ions 27i, for example of argon, nitrogen, fluorine, silicon, or germanium.

As an example, at the end of this step, the third embodiment is identical to the first embodiment.

As a variant, the step illustrated in FIG. 5 is followed by a step of forming of polysilicon contacts having no doping gradient. In this case, the ohmic contact between vias 39 and substrate 25 or gates 27 remains improved due to the crystallographic rearrangement resulting from the step of surface amorphization of the silicon at the bottom of openings 65.

An advantage of the described embodiments is that they enable to form polysilicon vias 39 in a lower level of the interconnection network with a doping gradient, thus improving the ohmic contact with gates 27 or substrate 25.

Various embodiments and variants have been described. Those skilled in the art will understand that certain features of these various embodiments and variants may be combined, and other variants will occur to those skilled in the art. In particular, the second and third embodiments may be combined.

Further, the described embodiments may apply in the context of a device comprising a single sensor illuminated on its upper surface. The interconnection network is thus made transparent to the radiations captured by the detectors of the same sensor.

Further, the embodiments are not limited to the examples of numerical values nor to the examples of materials mentioned in the present disclosure.

Finally, the practical implementation of the described embodiments and variants is within the abilities of those skilled in the art based on the functional indications given hereabove.

The invention claimed is:

1. An image sensor, comprising:
photodetection pixels formed inside and on top of a semiconductor substrate; and
an interconnection network over a surface of the semiconductor substrate, the interconnection network comprising conductive vias, wherein lower surfaces of the conductive vias are in electrical contact with the photodetection pixels;
wherein each conductive via is made of doped polysilicon; and
wherein the doped polysilicon has a heavier doping at the lower surface of the conductive via than at an upper surface of the conductive via.

2. The sensor according to claim 1, wherein doping of each conductive via has a decreasing doping gradient starting from the lower surface towards the upper surface.

3. The image sensor according to claim 1, wherein each conductive via is doped with phosphorus or arsenic atoms.

4. An image acquisition device, comprising:
a first image sensor comprising:
first photodetection pixels formed inside and on top of a first semiconductor substrate; and
an interconnection network over a surface of the first semiconductor substrate, the interconnection network comprising conductive vias, wherein lower surfaces of the conductive vias are in electrical contact with the first photodetection pixels;
wherein each conductive via is made of doped polysilicon; and
wherein the doped polysilicon has a heavier doping at the lower surface of the conductive via than at an upper surface of the conductive via; and
a second image sensor comprising second photodetection pixels formed inside and on top of a second semiconductor substrate;
wherein the first image sensor and the second image sensor are stacked.

5. The image acquisition device of claim 4, wherein the first photodetection pixels are configured for detection of visible light colors and the second photodetection pixels are configured for detection of infrared light.

6. The image acquisition device of claim 4, wherein an interconnection network of the second image sensor is in contact with the interconnection network of the first image sensor.

7. The image acquisition device of claim 4, wherein doping of each conductive via has a decreasing doping gradient starting from the lower surface towards the upper surface.

8. The image acquisition device of claim 4, wherein each conductive via is doped with phosphorus or arsenic atoms.

9. A method of manufacturing an image sensor, comprising:

forming photodetection pixels inside and on top of a semiconductor substrate; and forming a level of an interconnection network including conductive vias;

wherein lower surfaces of the conductive vias are in contact with the photodetection pixels;

wherein each conductive via is made of doped polysilicon; and wherein the doped polysilicon has a heavier doping at the lower surface of the conductive via than at an upper surface of the conductive via.

10. The method according to claim 9, wherein each conductive via has a decreasing doping gradient starting from the lower surface towards the upper surface.

11. The method according to claim 9, wherein forming the level of the interconnection network including conductive vias comprises forming openings in an insulating layer, said openings extending to contact the photodetection pixels.

12. The method according to claim 11, wherein the forming the level of the interconnection network including conductive vias further comprises:

forming an amorphous silicon film on top of the insulating layer and inside the openings;

ex-situ doping of said amorphous silicon film by implantation of dopants; and filling the openings with an amorphous silicon layer.

13. The method according to claim 12, wherein said amorphous silicon film, after ex-situ doping, has a doping in the order of $1 \times 10^{21}$ at/cm$^3$.

14. The method according to claim 13, wherein forming the amorphous silicon film comprises performing an in-situ doping during deposition of the amorphous silicon film.

15. The method according to claim 13, wherein filling the openings with the amorphous silicon layer comprises performing an in-situ doping during deposition of the amorphous silicon layer.

16. The method according to claim 11, further comprising, after forming the openings:

filling the openings with an amorphous silicon layer; and ex-situ doping of said amorphous silicon layer by implantation of dopants at a portion of said amorphous silicon layer located in a vicinity of the semiconductor substrate.

17. The method according to claim 16, further comprising in-situ doping of the amorphous silicon layer during deposition.

18. The method according to claim 16, wherein said amorphous silicon layer has a doping in the order of $1 \times 10^{21}$ at/cm$^3$ at a vicinity of the semiconductor substrate.

19. The method according to claim 11, further comprising, after forming the openings, performing an amorphization of a surface of the semiconductor substrate and of a surface of polysilicon conductive gates at the bottom of the openings.

* * * * *